United States Patent
Kris et al.

(10) Patent No.: US 11,443,420 B2
(45) Date of Patent: Sep. 13, 2022

(54) GENERATING A METROLOGY RECIPE USABLE FOR EXAMINATION OF A SEMICONDUCTOR SPECIMEN

(71) Applicant: Applied Materials Israel Ltd., Rehovot (IL)

(72) Inventors: Roman Kris, Jerusalem (IL); Grigory Klebanov, Rishon-LeZion (IL); Einat Frishman, Rehovot (IL); Tal Orenstein, Rehovot (IL); Meir Vengrover, Gedera (IL); Noa Marom, Karmei Katif (IL); Ilan Ben-Harush, Tel Aviv (IL); Rafael Bistritzer, Petach Tikva (IL); Sharon Duvdevani-Bar, Mazkeret-Batya (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 17/135,939

(22) Filed: Dec. 28, 2020

(65) Prior Publication Data
US 2022/0207681 A1 Jun. 30, 2022

(51) Int. Cl.
| | |
|---|---|
| *G06T 7/00* | (2017.01) |
| *G03F 7/20* | (2006.01) |
| *G01N 21/95* | (2006.01) |

(52) U.S. Cl.
CPC ......... *G06T 7/001* (2013.01); *G01N 21/9501* (2013.01); *G03F 7/7065* (2013.01); *G06T 2207/30148* (2013.01)

(58) Field of Classification Search
CPC .......... G06T 7/001; G06T 2207/30148; G01N 21/9501; G03F 7/7065

(Continued)

(56) References Cited

U.S. PATENT DOCUMENTS

| | | | | |
|---|---|---|---|---|
| 7,449,265 | B1 * | 11/2008 | Dixon | G03F 7/70625 |
| | | | | 430/30 |
| 10,527,953 | B2 * | 1/2020 | Bhattacharyya | G03F 7/70633 |

(Continued)

FOREIGN PATENT DOCUMENTS

WO 2020089910 A1 5/2020

OTHER PUBLICATIONS

Askary, Farid et al. "Importance of measurement accuracy in statistical process control;" Metrology, Inspection, and Process Control for Microlithography XIV, 2000; 9 pages; vol. 3998. International Society for Optics and Photonics.

(Continued)

*Primary Examiner* — Roy M Punnoose
(74) *Attorney, Agent, or Firm* — Lowenstein Sandler LLP

(57) ABSTRACT

There is provided a system and method of generating a metrology recipe usable for examining a semiconductor specimen, comprising: obtaining a first image set comprising a plurality of first images captured by an examination tool, obtaining a second image set comprising a plurality of second images, wherein each second image is simulated based on at least one first image, wherein each second image is associated with ground truth data; performing a first test on the first image set and a second test on the second image set in accordance with a metrology recipe configured with a first parameter set, and determining, in response to a predetermined criterion not being met, to select a second parameter set, configure the metrology recipe with the second parameter set, and repeat the first test and the second test in accordance with the metrology recipe configured with the second parameter set.

20 Claims, 9 Drawing Sheets

(58) Field of Classification Search
USPC .......................................................... 382/145
See application file for complete search history.

(56) References Cited

U.S. PATENT DOCUMENTS

| | | | |
|---|---|---|---|
| 11,307,150 B2* | 4/2022 | Bar .................... | G01N 21/9501 |
| 2010/0123736 A1* | 5/2010 | Fukudome .......... | G06F 3/04815 |
| | | | 345/660 |
| 2014/0205206 A1* | 7/2014 | Datar ................... | G06T 3/0012 |
| | | | 382/298 |
| 2021/0295499 A1* | 9/2021 | Levant ................ | G06K 9/6257 |

OTHER PUBLICATIONS

Bunday, B. et al. "Unified advanced critical dimension scanning elec-tron microscope (CD-SEM) specification for sub-65 nm technology;" International SEMATECH Manufacturing Initiative; Dec. 8, 2010, 186 pages.

Kris, Roman, et al. "Physical matching vs CD matching for CD SEM." Proc. of SPIE; Mar. 2007, 12 pages, vol. 6518.

Levi, Shimon, et al. "Roughness metrology of gate all around silicon nanowire devices;", Metrology, Inspection, and Process Control for Microlithography XXVI; Apr. 30, 2012, 14 pages, vol. 8324. International Society for Optics and Photonics.

Levi, Shimon, et al. "SEM simulation for 2D and 3D inspection metrology and defect review;" Advances in Patterning Materials and Processes XXXI., Apr. 2, 2014, 11 pages, vol. 9051. International Society for Optics and Photonics.

Levi, Shimon. "3D SEM characterization of advanced sidewall patterning process (Conference Presentation);" Metrology, Inspection, and Process Control for Microlithography XXXI; Apr. 28, 2017, 10 pages, vol. 10145, International Society for Optics and Photonics.

Menaker, Mina. "CD-SEM precision: improved procedure and analysis;" Metrology, Inspection, and Process Control tor Microlithography XIII; Mar. 1999, 8 pages, vol. 3677, International Society for Optics and Photonics.

Solecky, Eric, et al. "New comprehensive metrics and methodology for metrology tool fleet matching;" Metrology, Inspection, and Process Control for Microlithography XIX; May 10, 2005, 12 pages, vol. 5752, International Society for Optics and Photonics.

Su, Bo, et al. "Introduction to metrology applications in IC manufacturing;" Tutorial Texts in Optical Engineering, downloaded Oct. 2015, 184 pages, vol. TT101, SPIE.

Sun, Lei, et al. "Line edge roughness frequency analysis for SAQP process;" Optical Microlithography XXIX; Mar. 15, 2016, 7 pages, vol. 9780; International Society for Optics and Photonics.

* cited by examiner

GENERATING A METROLOGY RECIPE USABLE FOR EXAMINATION OF A SEMICONDUCTOR SPECIMEN

TECHNICAL FIELD

The presently disclosed subject matter relates, in general, to the field of examination of a semiconductor specimen, and more specifically, to metrology recipe generation usable for the examination of a specimen.

BACKGROUND

Current demands for high density and performance associated with ultra large-scale integration of fabricated devices require submicron features, increased transistor and circuit speeds, and improved reliability. As semiconductor processes progress, pattern dimensions such as line width, and other types of critical dimensions, are continuously shrunken. Such demands require formation of device features with high precision and uniformity, which, in turn, necessitates careful monitoring of the fabrication process, including automated examination of the devices while they are still in the form of semiconductor wafers.

Examination can be provided by using non-destructive examination tools during or after manufacture of the specimen to be examined. Examination generally involves generating certain output (e.g., images, signals, etc.) for a specimen by directing light or electrons to the wafer and detecting the light or electrons from the wafer. A variety of non-destructive examination tools includes, by way of non-limiting example, scanning electron microscopes, atomic force microscopes, optical inspection tools, etc.

Examination processes can include a plurality of examination steps. During the manufacturing process, the examination steps can be performed a multiplicity of times, for example after the manufacturing or processing of certain layers, or the like. Additionally or alternatively, each examination step can be repeated multiple times, for example for different wafer locations or for the same wafer locations with different examination settings.

Examination processes are used at various steps during semiconductor fabrication to detect and classify defects on specimens, as well as perform metrology related operations. Effectiveness of examination can be increased by automatization of process(es) as, for example, defect detection, Automatic Defect Classification (ADC), Automatic Defect Review (ADR), automated metrology-related operations, etc.

SUMMARY

In accordance with certain aspects of the presently disclosed subject matter, there is provided a computerized system of generating a metrology recipe usable for examining a semiconductor specimen, the system comprising a processor and memory circuitry (PMC) configured for: obtaining a first image set comprising a plurality of first images captured by an examination tool, each first image informative of at least one first image structural element (ISE) representing at least one structural element (SE) on the semiconductor specimen; obtaining a second image set comprising a plurality of second images, wherein each second image is simulated based on at least one first image and informative of at least one second ISE representing at least one SE, wherein the at least one second ISE in each second image is resized to a respective scale with reference to the at least one first ISE, and wherein each second image is associated with ground truth data related to the respective scale of the at least one second ISE; performing a first test on the first image set, comprising: performing a metrology operation on the first image set in accordance with a metrology recipe configured with a first parameter set, giving rise to a plurality of first measurements corresponding to the plurality of first images, and calculating a first score indicative of precision of the metrology recipe based on the plurality of first measurements; performing a second test on the second image set, comprising: performing the metrology operation on the second image set in accordance with the metrology recipe, giving rise to a plurality of second measurements corresponding to the plurality of second images, and calculating a second score indicative of sensitivity of the metrology recipe based on the plurality of second measurements with respect to the associated ground truth data; and determining, in response to a predetermined criterion related to the first score and the second score not being met, to select a second parameter set, configure the metrology recipe with the second parameter set, and repeat the first test and the second test in accordance with the metrology recipe configured with the second parameter set.

In addition to the above features, the system according to this aspect of the presently disclosed subject matter can comprise one or more of features (i) to (x) listed below, in any desired combination or permutation which is technically possible:

(i). The plurality of first images are captured from one or more sites on the semiconductor specimen.

(ii). The PMC is further configured for generating the second image set, comprising: generating a first design image based on the at least one first image, the first design image informative of at least one design structural element (DSE) corresponding to the at least one ISE and associated with first ground truth data related to a first scale of the at least one DSE; generating one or more additional design images each informative of the at least one DSE resized to a respective scale with reference to the first scale, giving rise to a plurality of design images comprising the first design image and the additional design images associated with respective ground truth data related to respective scales of the at least one DSE; and using the plurality of design images to generate the second image set, comprising: simulating, based on the plurality of design images, one or more effects caused by one or more physical processes of the semiconductor specimen, giving rise to the plurality of second images associated with the respective ground truth data.

(iii). The simulating one or more effects comprises: performing a first simulation on the plurality of design images to simulate effects caused by a fabrication process of the semiconductor specimen, giving rise to a plurality of first simulated images; performing a second simulation on the plurality of first simulated images to simulate effects caused by a scanning process of the semiconductor specimen, giving rise to a plurality of second simulated images; performing a third simulation on the plurality of second images to simulate effects caused by a signal processing process of the semiconductor specimen, giving rise to the plurality of second images; and associating the plurality of second images with the respective ground truth data.

(iv). The PMC is configured to calculate the first score by calculating variance among the plurality of first measurements based on a precision measure.

(v). The PMC is configured to calculate the second score by estimating a linear regression function between the plurality of second measurements and the associated ground truth data, and obtaining the second score based on the estimated linear regression function.

(vi). The PMC is further configured to obtain a third image set comprising at least one first image, and perform a third test on the third image set, comprising: perform a metrology operation on the third image set in accordance with the metrology recipe, and calculate a third score indicative of throughput of the metrology recipe based on duration of the metrology operation.

(vii). The first parameter set comprises a plurality of recipe parameters assigned with first values, the recipe parameters selected from a group comprising: measurement algorithm parameters and image generation parameters.

(viii). The second parameter set comprises the plurality of recipe parameters assigned with second values which are selected automatically using an optimization method.

(ix). The PMC is further configured to repeat the first test and the second test one or more times in accordance with the metrology recipe configured with one or more additional parameter sets, until the predetermined criterion is met, thereby generating a metrology recipe usable for runtime examination of a semiconductor specimen.

(x). The metrology recipe is defined in accordance with a metrology application selected from a group comprising: Measurement-Based Inspection (MBI), Critical Dimension Uniformity (CDU), Lithography process control, CAD Awareness (CADA) and Overlay (OVL).

In accordance with other aspects of the presently disclosed subject matter, there is provided a method for generating a metrology recipe usable for examining a semiconductor specimen, the method performed by a processor and memory circuitry (PMC) and comprising: obtaining a first image set comprising a plurality of first images captured by an examination tool, each first image informative of at least one first image structural element (ISE) representing at least one structural element (SE) on the semiconductor specimen; obtaining a second image set comprising a plurality of second images, wherein each second image is simulated based on at least one first image and informative of at least one second ISE representing the at least one SE, wherein the at least one second ISE in each second image is resized to a respective scale with reference to the at least one first ISE, and wherein each second image is associated with ground truth data related to the respective scale of the at least one second ISE; performing a first test on the first image set, comprising: performing a metrology operation on the first image set in accordance with a metrology recipe configured with a first parameter set, giving rise to a plurality of first measurements corresponding to the plurality of first images, and calculating a first score indicative of precision of the metrology recipe based on the plurality of first measurements; performing a second test on the second image set, comprising: performing the metrology operation on the second image set in accordance with the metrology recipe, giving rise to a plurality of second measurements corresponding to the plurality of second images, and calculating a second score indicative of sensitivity of the metrology recipe based on the plurality of second measurements with respect to the associated ground truth data; and determining, in response to a predetermined criterion related to the first score and the second score not being met, to select a second parameter set, configure the metrology recipe with the second parameter set, and repeat the first test and the second test in accordance with the metrology recipe configured with the second parameter set.

This aspect of the disclosed subject matter can comprise one or more of features (i) to (x) listed above with respect to the system, mutatis mutandis, in any desired combination or permutation which is technically possible.

In accordance with other aspects of the presently disclosed subject matter, there is provided a non-transitory computer readable medium comprising instructions that, when executed by a computer, cause the computer to perform a method for generating a metrology recipe usable for examining a semiconductor specimen, the method comprising: obtaining a first image set comprising a plurality of first images captured by an examination tool, each first image informative of at least one first image structural element (ISE) representing at least one structural element (SE) on the semiconductor specimen; obtaining a second image set comprising a plurality of second images, wherein each second image is simulated based on at least one first image and informative of at least one second ISE representing the at least one SE, wherein the at least one second ISE in each second image is resized to a respective scale with reference to the at least one first ISE, and wherein each second image is associated with ground truth data related to the respective scale of the at least one second ISE; performing a first test on the first image set, comprising: performing a metrology operation on the first image set in accordance with a metrology recipe configured with a first parameter set, giving rise to a plurality of first measurements corresponding to the plurality of first images, and calculating a first score indicative of precision of the metrology recipe based on the plurality of first measurements; performing a second test on the second image set, comprising: performing the metrology operation on the second image set in accordance with the metrology recipe, giving rise to a plurality of second measurements corresponding to the plurality of second images, and calculating a second score indicative of sensitivity of the metrology recipe based on the plurality of second measurements with respect to the associated ground truth data; and determining, in response to a predetermined criterion related to the first score and the second score not being met, to select a second parameter set, configure the metrology recipe with the second parameter set, and repeat the first test and the second test in accordance with the metrology recipe configured with the second parameter set.

This aspect of the disclosed subject matter can comprise one or more of features (i) to (x) listed above with respect to the system, mutatis mutandis, in any desired combination or permutation which is technically possible.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

Figure 1:
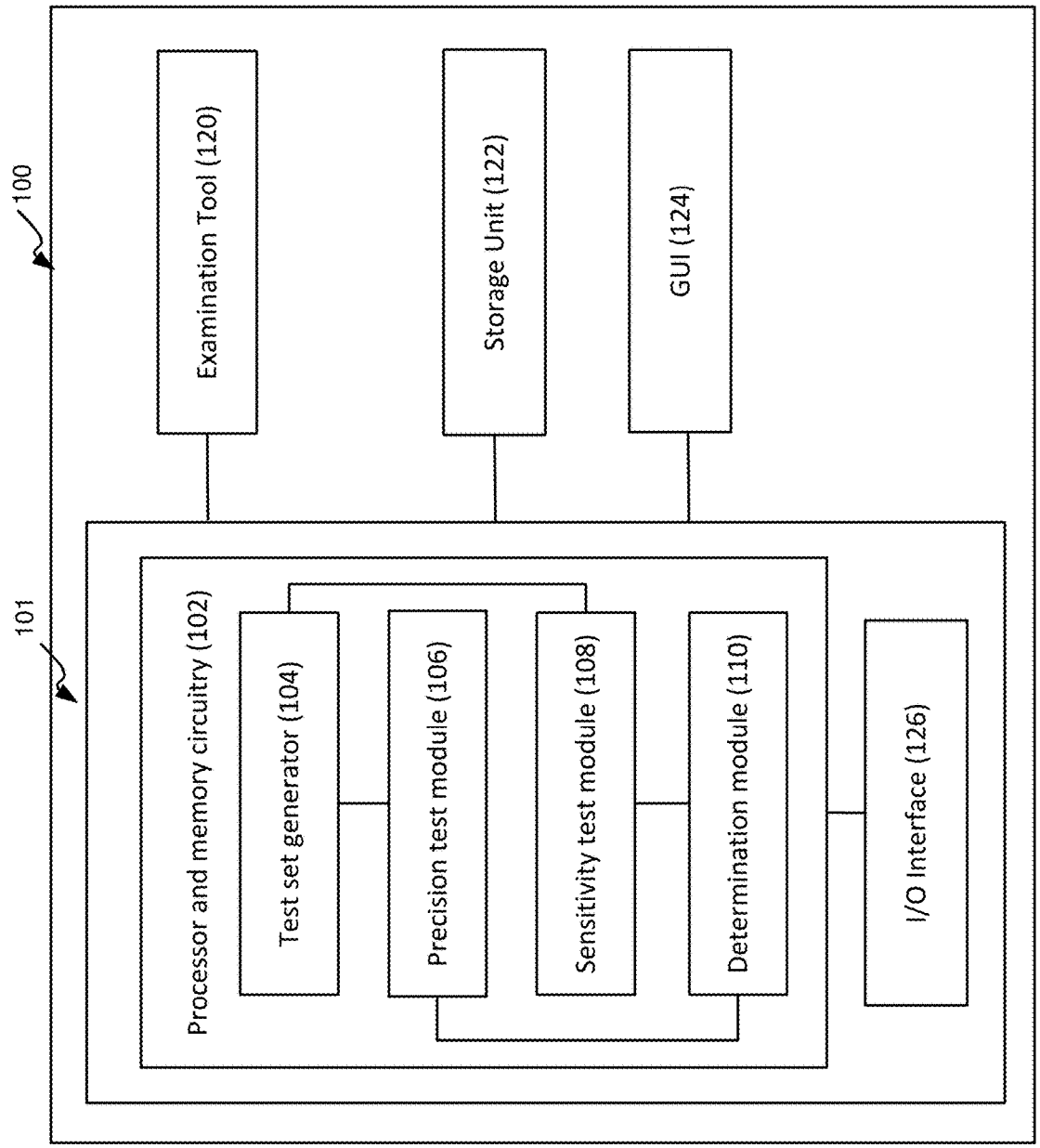
FIG. 1 illustrates a generalized block diagram of an examination system in accordance with certain embodiments of the presently disclosed subject matter.

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "generating", "simulating", "obtaining", "examining", "performing", "calculating", "determining", "selecting", "configuring", "repeating", "using", "associating", "estimating", or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the examination system, the metrology recipe generation system and respective parts thereof disclosed in the present application.

The term "examination" used in this specification should be expansively construed to cover any kind of metrology-related operations, as well as operations related to detection and/or classification of defects in a specimen during its fabrication. Examination is provided by using non-destructive examination tools during or after manufacture of the specimen to be examined. By way of non-limiting example, the examination process can include runtime scanning (in a single or in multiple scans), sampling, reviewing, measuring, classifying and/or other operations provided with regard to the specimen or parts thereof, using the same or different inspection tools. Likewise, examination can be provided prior to manufacture of the specimen to be examined, and can include, for example, generating an examination recipe(s) and/or other setup operations. It is noted that, unless specifically stated otherwise, the term "examination" or its derivatives used in this specification are not limited with respect to resolution or size of an inspection area. A variety of non-destructive examination tools includes, by way of non-limiting example, scanning electron microscopes, atomic force microscopes, optical inspection tools, etc.

The term "metrology" used in this specification should be expansively construed to cover any kind of measuring characteristics and features in a specimen provided by using examination and/or metrology tools during or after manufacture of the specimen to be inspected. By way of non-limiting example, the metrology process can include generating a measurement recipe and/or performing runtime measurement, for example by scanning (in a single or in multiple scans), reviewing, measuring and/or other operations provided with regard to the specimen or parts thereof using the same or different tools. Measurement results such as measured images are analyzed for example, by employing image-processing techniques. Note that, unless specifically stated otherwise, the term "metrology" or derivatives thereof used in this specification are not limited with respect to measurement technology, measurement resolution or size of inspection area.

The terms "non-transitory memory" and "non-transitory storage medium" used herein should be expansively construed to cover any volatile or non-volatile computer memory suitable to the presently disclosed subject matter.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "defect" used in this specification should be expansively construed to cover any kind of abnormality or undesirable feature formed on or within a specimen.

The term "design data" used in the specification should be expansively construed to cover any data indicative of hierarchical physical design (layout) of a specimen. Design data can be provided by a respective designer and/or can be derived from the physical design (e.g. through complex simulation, simple geometric and Boolean operations, etc.). Design data can be provided in different formats as, by way of non-limiting examples, GDSII format, OASIS format, etc. Design data can be presented in vector format, grayscale intensity image format, or otherwise.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Bearing this in mind, attention is drawn to FIG. 1 illustrating a functional block diagram of an examination system in accordance with certain embodiments of the presently disclosed subject matter.

The examination system 100 illustrated in FIG. 1 can be used for examination of a semiconductor specimen (e.g. of a wafer and/or parts thereof) as part of the specimen fabrication process. According to certain embodiments of the presently disclosed subject matter, the illustrated examination system 100 comprises a computer-based system 101 capable of automatically generating a metrology recipe using images obtained during specimen fabrication (referred to hereinafter as fabrication process (FP) images). System 101 is thus also referred to as a recipe generation system in the present disclosure. System 101 can be operatively connected to one or more examination tools 120. The metrology recipe as generated by system 101 can be used by the examination tool(s) 120 for examination of a semiconductor specimen. In some embodiments, at least one of the examination tools 120 has metrology capabilities and can be configured to capture FP images and perform metrology operations on the captured images. Such an examination tool is also referred to as a metrology tool.

By way of example, FP images that can be used for generating the recipe can be selected from images of a specimen (e.g. wafer or parts thereof) captured during the manufacturing process, derivatives of the captured images obtained by various pre-processing stages (e.g. images of a part of a wafer or a photomask captured by a scanning electron microscope (SEM) or an optical inspection system, registered images of different examination modalities corresponding to the same mask location, segmented images, height map images, etc.) and computer-generated design data-based images. It is to be noted that in some cases the images can include image data (e.g. captured images, processed images, etc.) and associated numeric data (e.g. metadata, hand-crafted attributes, etc.). It is further noted that image data can include data related to a layer of interest and/or to one or more other layers of the specimen.

The term "examination tool(s)" used herein should be expansively construed to cover any tools that can be used in examination-related processes, including, by way of non-limiting example, imaging, scanning (in a single or in multiple scans), sampling, reviewing, measuring, classifying and/or other processes provided with regard to the specimen or parts thereof.

By way of example, a specimen can be examined by one or more low-resolution examination tools (e.g. an optical inspection system, low-resolution SEM, etc.). The resulting data (referred to as low-resolution image data), informative of low-resolution images of the specimen, can be transmitted—directly or via one or more intermediate systems—to system 101. Alternatively, or additionally, the specimen can be examined by a high-resolution tool (e.g. a scanning electron microscope (SEM) or Atomic Force Microscopy (AFM) or Transmission Electron Microscope (TEM)). The resulting data (referred to as high-resolution image data), informative of high-resolution images of the specimen, can be transmitted—directly or via one or more intermediate systems—to system 101.

Without limiting the scope of the disclosure in any way, it should also be noted that the examination tools 120 can be implemented as examination machines of various types, such as optical imaging machines, electron beam inspection machines, and so on. In some cases, the same examination tool can provide low-resolution image data and high-resolution image data.

System 101 includes a processor and memory circuitry (PMC) 102 operatively connected to a hardware-based I/O interface 126. PMC 102 is configured to provide processing necessary for operating the system as further detailed with reference to FIGS. 2A, 2B, 3A and 3B, and comprises a processor (not shown separately) and a memory (not shown separately). The processor of PMC 102 can be configured to execute several functional modules in accordance with computer-readable instructions implemented on a non-transitory computer-readable memory comprised in the PMC. Such functional modules are referred to hereinafter as comprised in the PMC.

As aforementioned, system 101 is configured to automatically generate a metrology recipe (in particular, a parameter set) usable for examining a semiconductor specimen. The term "metrology recipe" should be expansively construed to cover any recipe that can be used by an examination tool (or more specifically, a metrology tool) for performing metrology operations during a runtime measurement phase. The term "metrology operation" used in this specification should be expansively construed to cover any metrology operation procedure used to extract metrology information relating to one or more structural elements on a semiconductor specimen. The term "parameter set" should be used to cover any set of parameters related to metrology operations. By way of example, metrology information to be extracted can be indicative of one or more of the following: dimensions (e.g., line widths, line spacing, contacts diameters, size of the element, edge roughness, gray level statistics, etc.), shapes of elements, distances within or between elements, related angles, overlay information associated with elements corresponding to different design levels, etc. The metrology operations can include measurement operations which can include structure-based measurements, rule-based measurements, measurements based on templates, measurements associated with geometric properties such as distances and angles, and/or other measurements.

Metrology recipe parameters are conventionally tuned manually at the customer site, which is normally performed under time pressure. Such manual tuning is time-consuming. Typically, the recipe performance test needs to run on thousands of combinations of parameter values of critical recipe parameters, for which an exhaustive parameter search is performed, which is a recipe creation throughput (TPT) killer. In addition, such manual tuning requires expert level of application knowledge, which adds another layer of difficulty for the customer to ensure the quality of the manual work.

Due to these difficulties, currently only a precision test is performed to evaluate the precision measure of the recipe performance. Another important performance measure, sensitivity, is not tested, since it is complicated, and it is not always possible to perform a sensitivity test "on the fly" during the recipe creation. This is at least partially because it is problematic to obtain the ground truth data for the FP images in the FAB environment. For obtaining ground truth data, a reference tool is typically needed, which can be destructive. Therefore, even after performing the precision test, the sensitivity performance of the tuned recipe is often still not good, and the trade-off between the sensitivity vs. precision measure is not satisfying.

Certain embodiments of the present disclosure propose a system and method of automatic metrology recipe creation which not only automates the recipe tuning/optimization process, but also enables the sensitivity test to be performed in addition to the precision test, as will be described below in further detail with reference to FIGS. 2A, 2B, 3A and 3B.

According to certain embodiments, functional modules comprised in PMC 102 can include a test set generator 104, a precision test module 106, a sensitivity test module 108 and a determination module 110. The PMC 102 can be configured to obtain, via I/O interface 126, a first image set comprising a plurality of first images captured by an examination tool. Each first image is informative of at least one first image structural element (ISE) representing at least one structural element (SE) on the semiconductor specimen. The PMC 102 can be further configured to obtain, via I/O interface 126, a second image set comprising a plurality of second images. Each second image can be simulated based on at least one first image and informative of at least one second ISE representing the at least one SE. The at least one second ISE in each second image is resized to a respective scale with reference to the at least one first ISE. Each second image is associated with ground truth data related to the respective scale of the at least one second ISE.

The precision test module 106 can be configured to perform a first test on the first image set, comprising: perform a metrology operation on the first image set in accordance with a metrology recipe configured with a first parameter set, giving rise to a plurality of first measurements corresponding to the plurality of first images, and calculate a first score indicative of precision of the metrology recipe based on the plurality of first measurements.

The sensitivity test module 108 can be configured to perform a second test on the second image set, comprising: perform the metrology operation on the second image set in accordance with the metrology recipe, giving rise to a plurality of second measurements corresponding to the plurality of second images, and calculate a second score indicative of sensitivity of the metrology recipe based on the plurality of second measurements with respect to the associated ground truth data.

The determination module 110 can be configured to determine, in response to the predetermined criterion not being met, to select a second parameter set, configure the metrology recipe with the second parameter set, and repeat the first test and the second test in accordance with the metrology recipe configured with the second parameter set.

Operations of system 101, PMC 102 and the functional modules therein, will be further detailed with reference to FIGS. 2A, 2B, 3A and 3B.

According to certain embodiments, system 101 can comprise a storage unit 122. The storage unit 122 can be configured to store any data necessary for operating system 101, e.g., data related to input and output of system 101, as well as intermediate processing results generated by system 101. By way of example, the storage unit 122 can be configured to store the FP images and/or derivatives thereof produced by the examination tool 120. Accordingly, the one or more FP images can be retrieved from the storage unit 122 and provided to the PMC 102 for further processing.

In some embodiments, system 101 can optionally comprise a computer-based Graphical User Interface (GUI) 124 which is configured to enable user-specified inputs related to system 101. For instance, the user can be presented with a visual representation of the specimen (for example, by a display forming part of GUI 124), including image data of the specimen. The user may be provided, through the GUI, with options of defining certain operation parameters. In some cases the user may also view operation results on the GUI.

As will be further detailed with reference to FIGS. 2A and 2B, system 101 is configured to receive, via I/O interface 126, FP input data. FP input data can include data (and/or derivatives thereof and/or metadata associated therewith) produced by the examination tools 120 and/or data stored in one or more data depositories. It is noted that in some cases FP input data can include image data (e.g. captured images, images derived from the captured images, simulated images, synthetic images, etc.) and associated numeric data (e.g. metadata, hand-crafted attributes, etc.). It is further noted that image data can include data related to a layer of interest and/or to one or more other layers of the specimen.

System 101 is further configured to process the received FP input data and send, via I/O interface 126, the results or part thereof (e.g., the generated metrology recipe) to the storage unit 122, and/or the examination tool 120.

In some embodiments, additionally to the examination tool 120, the examination system 100 can comprise one or more examination modules, such as, e.g., defect detection module and/or Automatic Defect Review Module (ADR) and/or Automatic Defect Classification Module (ADC) and/or a metrology-related module and/or other examination modules which are usable for examination of a semiconductor specimen. The one or more examination modules can be implemented as stand-alone computers, or their functionalities (or at least part thereof) can be integrated with the examination tool 120. In some embodiments, the generated metrology recipe can be used by the examination tool 120 and/or the one or more examination modules (or part thereof) for examination of the specimen.

For purpose of illustration only, certain embodiments of the following description are provided for generating a metrology recipe usable for metrology-related examination of a semiconductor specimen. Those skilled in the art will readily appreciate that the teachings of the presently disclosed subject matter are applicable to various examinations such as, for example, defect detection, ADR, ADC, and alike.

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

It is noted that the examination system illustrated in FIG. 1 can be implemented in a distributed computing environment, in which the aforementioned functional modules as comprised in the PMC 102 can be distributed over several local and/or remote devices, and can be linked through a communication network. It is further noted that in other embodiments at least some of the examination tool(s) 120, storage unit 122 and/or GUI 124 can be external to the examination system 100 and operate in data communication with system 101 via I/O interface 126. System 101 can be implemented as stand-alone computer(s) to be used in conjunction with the examination tools. Alternatively, the respective functions of the system 101 can, at least partly, be integrated with one or more examination tools 120, thereby facilitating and enhancing the functionalities of the examination tools 120 in examination-related processes.

Figure 2A:
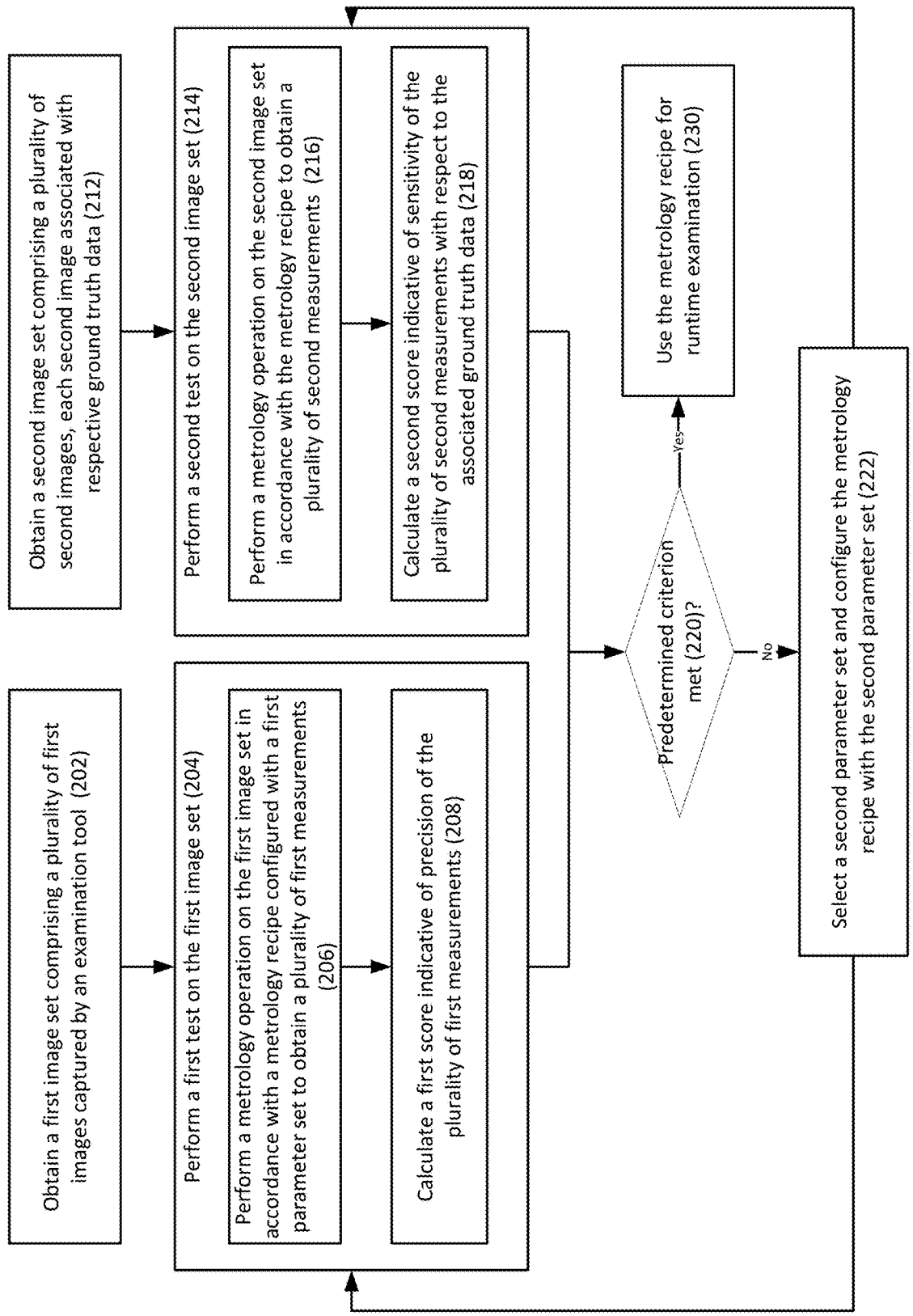
FIG. 2A illustrates a generalized flowchart of generating a metrology recipe usable for examination of a semiconductor specimen in accordance with certain embodiments of the presently disclosed subject matter.

Referring to FIG. 2A, there is illustrated a generalized flowchart of generating a metrology recipe usable for examination of a semiconductor specimen in accordance with certain embodiments of the presently disclosed subject matter.

A first image set can be obtained (202) (e.g., by the PMC 102 via I/O interface 126). The first image set comprises a plurality of first images captured by an examination tool. Each first image is informative of at least one first image structural element (ISE) representing at least one structural element (SE) on the semiconductor specimen.

The first images can be FP images of a semiconductor specimen captured by an examination tool. By way of example, the first images can be captured by a low-resolution examination tool (e.g. an optical inspection system, low-resolution SEM, etc.). Alternatively, the first images can be captured by a high-resolution examination tool (e.g., high-resolution SEM, AFM, TEM, etc.). A structural element (SE) used herein can refer to any original object on the specimen that has a geometrical shape or geometrical structure with a contour, in some cases combined with other object(s). Examples of structural elements can include general shape features, including, such as, e.g., contacts, line/space structures, etc. An image structural element (ISE) refers to the image representation of the SE in the captured images, and can be presented, e.g., in the form of a polygon.

In some embodiments, the first images can be SEM images captured by a SEM tool, each first image representing at least part of the specimen (e.g., a part of a die of a wafer). In some cases, the first images are captured from one or more sites/fields on the specimen. For instance, the first image set can comprise a plurality of subsets of images captured from a plurality of sites on the specimen that share the same design pattern (e.g., the sites are located at the same place in the dies). The first image set can be used for performing a first test (i.e., precision test), as described below with reference to block 204.

A second image set can be obtained (212) (e.g., by the PMC 102 via I/O interface 126). The second image set comprises a plurality of second images. Each second image is simulated based on at least one first image and is informative of at least one second ISE representing the at least one SE on the specimen. In other words, the second image is a simulated image generated by performing simulation based on the at least one first image. The at least one second ISE in each second image is resized to a respective scale with reference to the at least one first ISE, and each second image is associated with ground truth data related to the respective scale of the at least one second ISE. The second image set can be used for performing a second test (i.e., sensitivity test), as described below with reference to block 214.

Figure 3A:
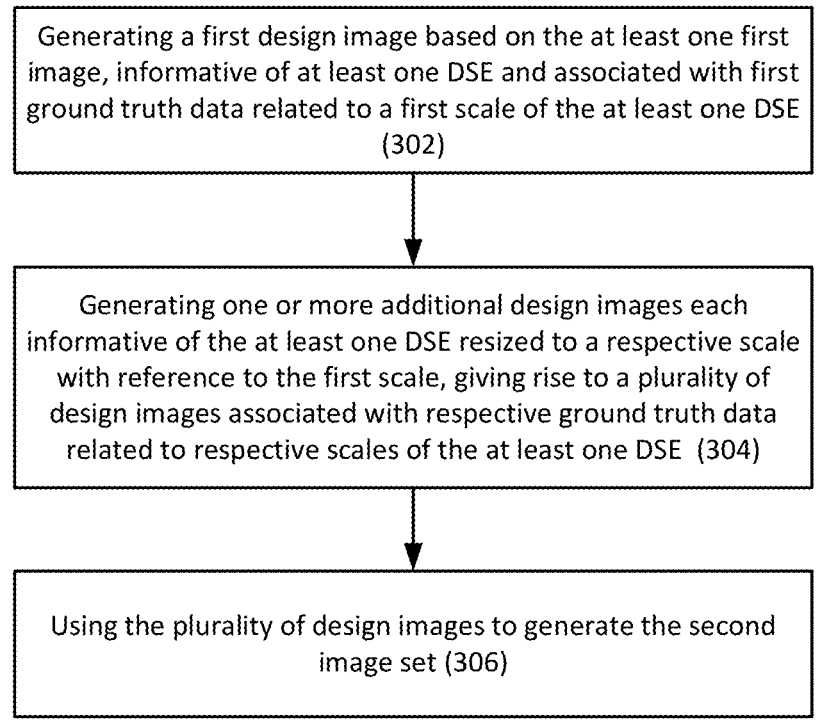
FIG. 3A illustrates a generalized flowchart of generating the second image set in accordance with certain embodiments of the presently disclosed subject matter.

FIG. 3A illustrates a generalized flowchart of generating the second image set in accordance with certain embodiments of the presently disclosed subject matter. The second image set can be generated, e.g., by an image simulator module (not illustrated) as comprised in the test set generator 104.

A first design image can be generated (302) based on at least one first image. The first design image is informative of at least one design structural element (DSE) corresponding to the at least one ISE and associated with first ground truth data related to a first scale (e.g., geometric size) of the at least one DSE. Specifically, the first image (e.g., a SEM image) can be analyzed and feature extraction can be performed on the first image. The extracted features can be used to simulate a first design image corresponding to the first image. By way of example, the first design image can be a simulated CAD image.

Figure 4:
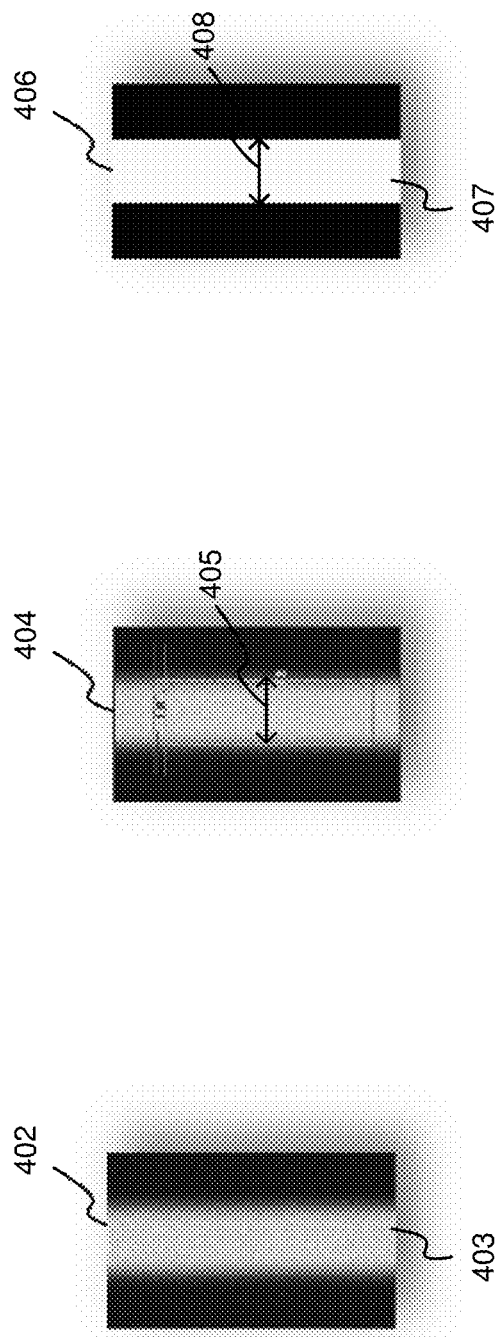
FIG. 4 illustrates an example of a first design image in accordance with certain embodiments of the presently disclosed subject matter.

Referring now to FIG. 4, there is illustrated an example of a first design image in accordance with certain embodiments of the presently disclosed subject matter. As shown, an exemplary first image—a SEM image 402 is obtained, which comprises an image structural element (ISE) 403 presented therein (exemplified in the shape of a column). Feature extraction is performed on the SEM image 402. By way of example, the extracted features can include one or more measurements related to the ISE 403, such as, e.g., the width 405 of the ISE, etc. Other features may include features representative of the structure and/or pattern of the ISE, such as, e.g., edges, corners, pixel intensities, etc. A simulated design image 406 corresponding to the first image 402 can be generated based on the extracted features. As shown, the design image 406 comprises a design structural element (DSE) 407 corresponding to the ISE 403. The DSE 407 has a first scale/size associated therewith, such as, e.g., the width 408 thereof which corresponds to the width 405 of the ISE 403. The first scale can serve as first ground truth data associated with the DSE.

It is to be noted that the first scale of the DSE is not necessarily the same as the scale of the ISD. It is also to be noted that although the width is used as an example of a measurement indicative of the geometric size of the structural elements, this should not be regarded as limiting the present disclosure in any way. Other suitable critical dimension (CD) measurements can be used in addition to or in lieu of the above.

Continuing with the description of FIG. 3A, one or more additional design images can be generated (304), each informative of the at least one DSE resized to a respective scale with reference to the first scale, giving rise to a plurality of design images comprising the first design image and the additional design images associated with respective ground truth data related to respective scales of the at least one DSE.

Figure 5:
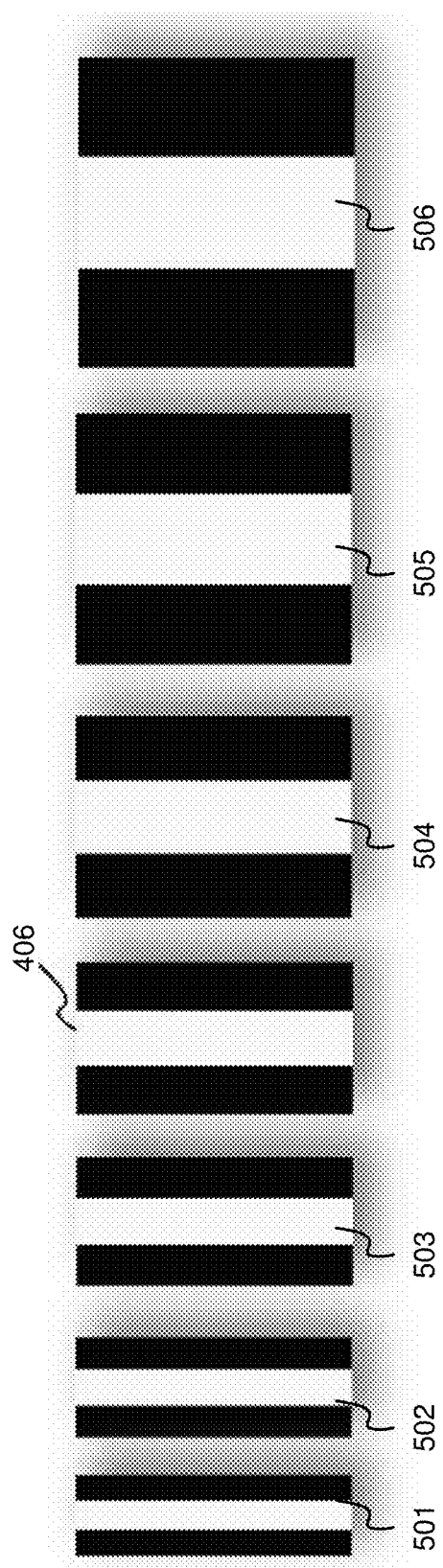
FIG. 5 illustrates an example of additional design images in accordance with certain embodiments of the presently disclosed subject matter.

Referring now to FIG. 5, there is illustrated an example of additional design images in accordance with certain embodiments of the presently disclosed subject matter. As shown, the first design image 406 as generated in the example of FIG. 4 is illustrated. Assume the width 405 of the ISE in SEM image 402 is 10 nm, and the width 408 of the DSE in the design image 406 is X nm (as described above, X is not necessarily equal to 10 nm). Additional design images can be generated by changing the size of the DSE. In the present example, the width can be resized to a plurality of different scales, such as, e.g., X−3, X−2, X−1, X+1, X+2, and X+3 nm, thereby giving rise to a plurality of additional design images with the resized scales, as illustrated respectively in images 501-506. Together with the design image 406, seven design images are created, each associated with a respective scale of the DSE therein.

Continuing with the description of FIG. 3A, the plurality of design images can be used (306) to generate the second image set, comprising: simulating, on the plurality of design images, one or more effects caused by one or more physical processes of the semiconductor specimen, giving rise to the plurality of second images associated with the respective ground truth data. By way of example, in cases where the first image is a real SEM image, the first design image is a simulated CAD image based on the SEM image, and the second images are simulated SEM images based on the simulated CAD images. According to certain embodiments, the effects can refer to variations caused by one or more of the following physical processes: manufacturing/fabrication process (e.g., printing the design patterns of the specimen on the wafer by an optical lithography tool), scanning process, signal processing process in the examination tool, etc.

Figure 3B:
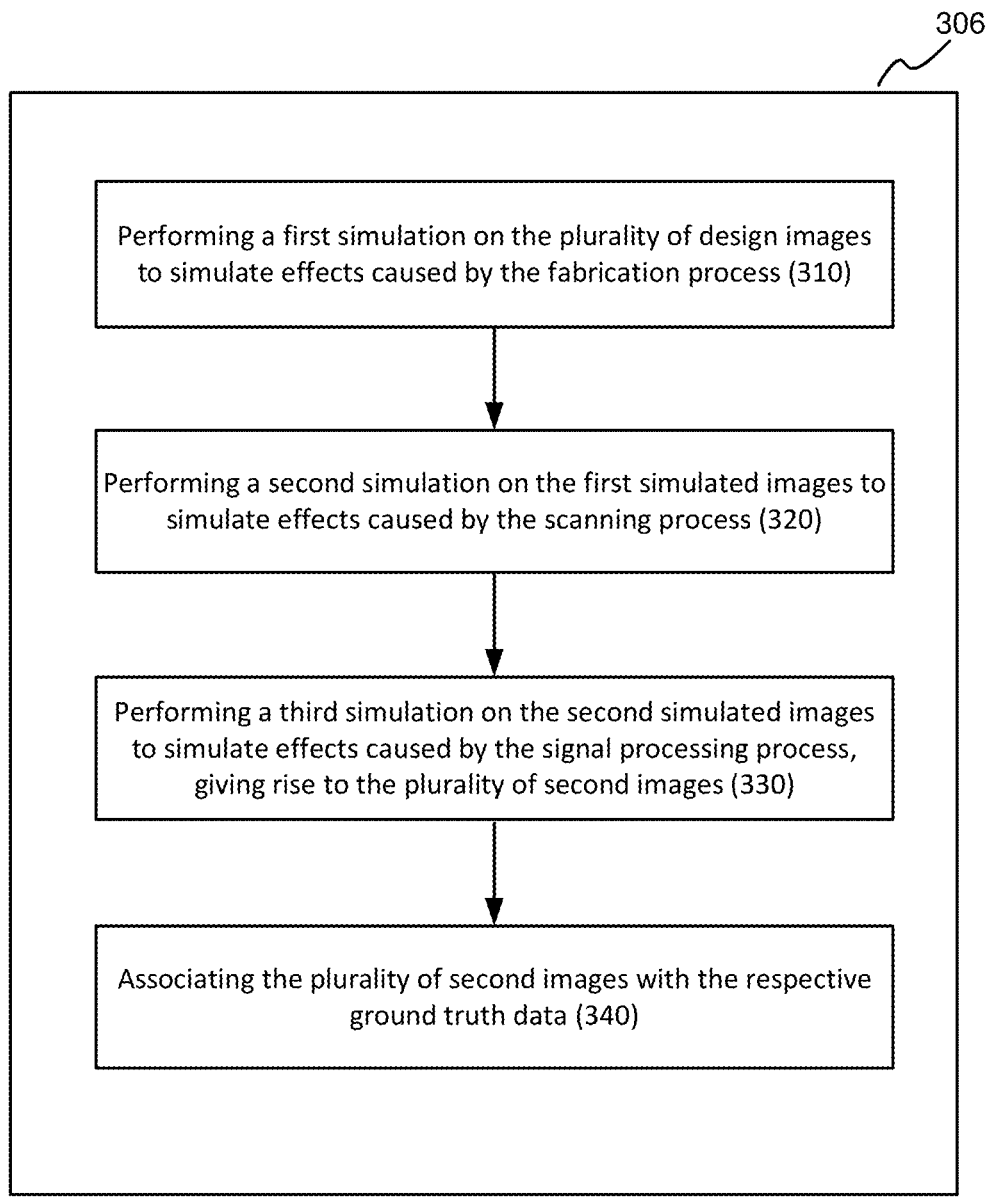
FIG. 3B illustrates a generalized flowchart of an exemplary simulation process used to generating the second images in accordance with certain embodiments of the presently disclosed subject matter.

FIG. 3B illustrates a generalized flowchart of an exemplary simulation process used to generate the second images in accordance with certain embodiments of the presently disclosed subject matter.

As shown, a first simulation is performed (310), where effects caused by the fabrication process can be simulated, based on the plurality of design images. The simulated images, after the first simulation (also referred to as first simulated images), represent how the design patterns in the design images would actually appear on the wafer. In other words, the first simulation transfers the design intent layout to the expected processed pattern on the wafer. Such simulation is also referred as stepper simulation, and can be performed, e.g., by convolving the CAD data (e.g., in the form of rasterized CAD) with a stepper beam shape filter. The stepper simulation assumes a Gaussian shape of the stepper optical beam. For example, the patterns on the wafer can be defined as thresholding of convolution of the binary CAD image with a Gaussian filter simulating the stepper optical beam shape.

In some cases, process variation (PV) can be considered during the first simulation. Process variation can refer to variations caused by a change in the fabrication process of the specimen. By way of example, the fabrication process may cause slight shifting/scaling/distortion of certain structures/patterns between different images which results in pattern variation in the images. By way of another example, the fabrication process may cause thickness variation of the specimen, which affects reflectivity, thus in turn affecting gray level of the resulting image. For instance, die-to-die material thickness variation can result in a different reflectivity between two of the dies, which leads to a different background gray level value for the images of the two dies.

A second simulation can be performed (320), where effects caused by the scanning process can be simulated based on the first simulated images. The scanning process refers to the process when the specimen is scanned by the examination tool, thereby generating an examination signal. The simulated images after the second simulation (also referred to as second simulated images) are representative of the examination signal as generated by yield of electrons from the specimen and prior to entering the detector for further signal processing. By way of example, the specimen can be scanned by a SEM beam of a SEM tool, thereby obtaining a SEM signal which enters the SEM detector. The second simulation, in such cases, aims to simulate the SEM signal entering the SEM detector. As known, a SEM beam has a Gaussian shape. By way of example, the SEM signal can be obtained by a convolution of wafer Electron Yield (represented by a signal from hypothetic zero width electron beam) with the SEM beam (represented by a SEM point spread function (PSF)). The wafer Electron Yield can be defined based on wafer topography as presented on the first simulated images. For simplicity, in some cases, it can be recognized that the wafer Electron Yield is proportional to the patterns of the wafer topography on the first simulated images and is related to the material properties of the patterns.

Next, a third simulation can be performed (330), where effects caused by the signal processing process can be simulated based on the second simulated images. The signal processing process refers to the signal processing path where the examination signal (e.g., the SEM signal) is processed by the signal processing module in the examination tool, giving rise to an output examination image (e.g., SEM image). The third simulation reflects influence of the signal path on both signal and noise. In some cases, it can be based on a generalized theory that unifies stochastic, deterministic, continuous, and discrete behaviors. The simulated images after the third simulation (also referred to as third simulated images) are the second images that constitute the second image set. By way of example, in cases where the specimen is examined by a SEM tool, the resulted second images from the above simulation process are simulated SEM images. Since the plurality of design images are associated with respective ground truth data related to respective scales of the at least one DSE, the second images which are generated corresponding to the plurality of design images can be also associated (340) with the respective ground truth data.

Continuing with the example in FIG. 5, as described above, each of the seven design images 501-506 and 406 is associated with a respective scale of the DSE, e.g., the resized scales of the width of the DSE. Using the process as described with reference to FIG. 3B, seven corresponding second images are generated. The respective scales of the DSE can be associated with the second images, which serve as ground truth data associated therewith.

It is to be noted that although in the above example, the respective scales are directly used as the ground truth data, in some other cases, the ground truth data can be measurement data related to the respective scales. By way of example, the ground truth data can be a relative measurement with respect to multiple elements, such as, e.g., a distance between the DSE in the images of FIG. 5 and another DSE (not illustrated). Therefore, notwithstanding the examples described herein, which are non-limiting, the present disclosure is applicable to any ground truth data that is, or can be derived or related to the respective scales of the at least one second ISE.

Figure 6:
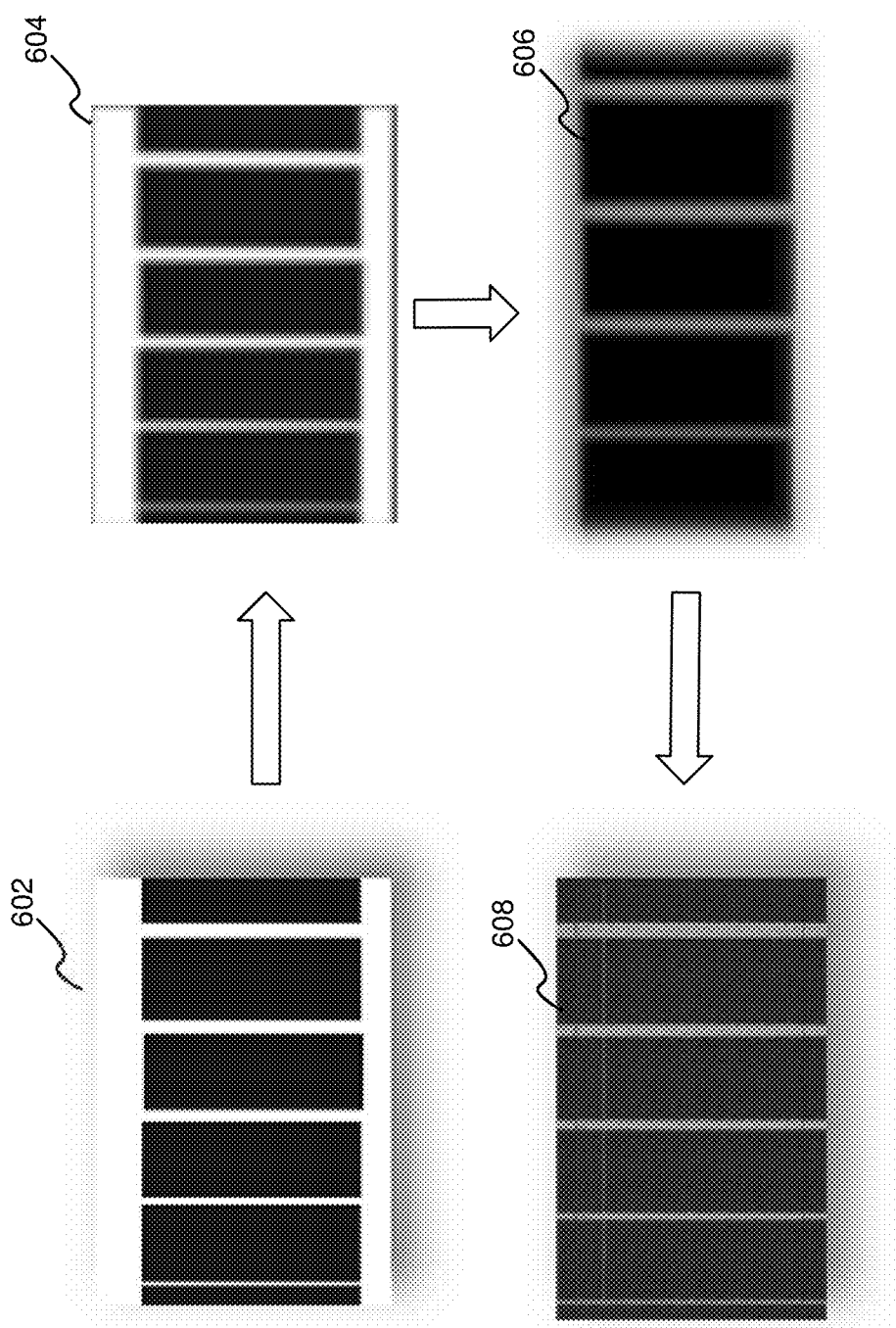
FIG. 6 illustrates exemplary simulated images generated using the simulation process described with reference to FIG. 3B in accordance with certain embodiments of the presently disclosed subject matter.

FIG. 6 illustrates exemplary simulated images generated using the simulation process described with reference to FIG. 3B in accordance with certain embodiments of the presently disclosed subject matter.

As shown, image 602 is an example of a simulated design image generated as described with reference to FIG. 4. Image 602 serves as the input of the first simulation described with reference to block 310 where the effects caused by the fabrication process are simulated. The output of the first simulation is exemplified as image 604, illustrating how the design layout in the design image 602 would be expected to look like on the wafer after the fabrication process. The second simulation, as described above with reference to block 320, is performed on image 604, where the effects caused by the scanning process by a SEM tool are simulated. The output of the second simulation is exemplified as image 606, representing the SEM signal as reflected from the specimen and prior to entering the SEM detector for further signal processing. The image 606 is then provided as input for the third simulation, where a simulated SEM image 608 is generated after simulating the SEM signal path, as described above with reference to block 330.

It is to be noted that the above described simulated effects with reference to FIGS. 3B and 6 are illustrated for exemplary purposes, and should not be regarded as limiting the present disclosure in any way. Other possible effects (e.g., noise, focusing error, shadow effects, charging effects, etc.), and/or effects caused by other physical processes, can be simulated in addition to or in lieu of the above for generating the second images.

It is also be noted that in some embodiments, the second image set generation as described with reference to FIG. 3A can be performed by the test set generator 104 as comprised in the PMC of system 101. In such cases, the functionality of the test set generation is integrated within system 101. Alternatively, in some other embodiments, the functionality of the test set generation, or at least part thereof, can be implemented in a separate computer system, and the resulted test set can be sent to system 101 for further processing.

Referring back to FIG. 2A, as described above, the first image set is used for performing a first test (i.e., precision test), and the second image set, which is generated as described above, is used for performing a second test (i.e., sensitivity test).

Specifically, the first test can be performed (204) (e.g., by the precision test module 106) on the first image set. The first test comprises: performing (206) a metrology operation on the first image set in accordance with a metrology recipe configured with a first parameter set, giving rise to a plurality of first measurements corresponding to the plurality of first images, and calculating (208) a first score indicative of precision of the metrology recipe based on the plurality of first measurements.

Precision refers to the closeness of agreement between independent measurements on the same feature of a specimen. By way of example, high precision indicates that the independent measurements of the same feature are repeatable (i.e., the measurements have small variance with one another and the measurement distribution is relatively close). In some embodiments, precision can be regarded as measurement repeatability. In some other embodiments, precision can comprise two components: repeatability and reproducibility. Repeatability refers to a measure of measurement result distribution, where consecutive measurements are conducted repeatedly on the same site of the specimen, without any operator intervention. The cause for variation within repeated measurements results can be mainly due to the statistical nature of the tool signal (e.g., SEM signal), and the interpretation of the new set of signals by the measurement algorithm as comprised in the recipe.

Reproducibility refers to another measure of measurement result distribution, where the measurements are obtained from different sites of the same specimen at different times. It accounts for the other sources of variation between independent measurements: wafer alignment, SEM autofocus, pattern recognition, tool stability etc.

For performing the precision test, the first images in the first image set are captured from one or more sites/fields of the specimen. By way of example, the first image set can comprise a plurality of subsets of images captured from a plurality of sites on the specimen that share the same design pattern (e.g., the sites are located at the same position in different dies). The plurality of sites can be selected to reflect the in-homogeneity across the specimen. For instance, ten sites can be selected from ten dies on the wafer, each containing the same structural element 403 as exemplified in FIG. 4. For each of the ten sites, ten SEM images (similar to the SEM image 402 as exemplified in FIG. 4) can be captured, giving rise to a total of 100 SEM images constituting the first image set which can be used for performing the precision test.

According to certain embodiments, the metrology recipe can be initially configured with a first parameter set. A metrology operation can be performed on each of the plurality of first images in accordance with the configured metrology recipe, giving rise to a plurality of first measurements corresponding to the plurality of first images. Continuing with the above example in FIG. 4, assume the metrology operation is to measure the width of the structural element 403, thus after performing the metrology operation on the image set of 100 SEM images, 100 width measurements can be obtained corresponding to the 100 SEM images.

The first score (i.e., precision score) can be obtained by calculating variance between the plurality of first measurements based on a precision measure. The precision measure can be related to the repeatability and/or reproducibility of the measurements as described above. By way of example, a repeatability variance can be calculated based on the variance of the measurements obtained for each site. For example, for the ten measurements corresponding to one site on the specimen, the repeatability variance can be calculated as:

$$3 * \sqrt{\frac{1}{n-2} \left[ \sum (y - \langle y \rangle)^2 - \frac{[\sum (x - \langle x \rangle)(y - \langle y \rangle)]^2}{\sum (x - \langle x \rangle)^2} \right]}$$

Where n is the sample size which in the present example is 10, x indicates the respective sites ranging from 1-10, y refers to the respective measurements of the 10 sites, and $\langle x \rangle$ and $\langle y \rangle$ refer to respective average values of x and y.

A reproducibility variance can be calculated based on the variance of the average site differences. For example, for the ten sites on the specimen, the reproducibility variance can be calculated as: $3*\sqrt{\sum(y\_i - \langle y \rangle)^2/(N-1)}$, where y_i refers to an average CD value measured at i-site, and $\langle y \rangle$ refers to an average value for ten measurements at ten sites. In some cases, the precision score can be calculated based on the repeatability variance. For instance, in the above example, a precision score can be calculated for each site based on the ten measurements obtained from the ten SEM images for the site. In some other cases, the precision score can be calculated based on the repeatability variance and reproducibility variance, e.g., Precision [nm]= $\sqrt{repeatability^2 + reproducibility^2}$. An example of calculating a precision score is described in "CD-SEM Precision—Improved Procedure & Analysis", Proc. SPIE 3677, Metrology, Inspection, and Process Control for Microlithography XIII, which is incorporated herein in its entirety by reference.

As aforementioned, the metrology recipe used herein refers to any recipe that can be used by an examination tool (or more specifically, a metrology tool) for performing metrology operations in runtime. A metrology recipe typically comprises a large number of different parameters. In some cases, the parameter set as referred to herein can comprise a set of critical parameters as selected from all the recipe parameters. For instance, the parameter set can comprise one or more of the following: measurement algorithm parameters (such as, e.g., feature extraction parameters) and image generation parameters, etc. The first parameter set used herein refers to the parameter set where the recipe parameters are assigned with first values (e.g., values that are selected initially or by default). Similarly, the second parameter set used herein refers to the parameter set where the recipe parameters are assigned with second values (e.g., values that are re-determined/re-selected as compared to the first values).

In some embodiments, the metrology recipe can be defined in accordance with a specific metrology application. A metrology application refers to what a customer/user is interested to measure in general with respect to the specimen. By way of non-limiting example, a metrology application can be selected from a group of metrology applications comprising: Measurement-Based Inspection (MBI), Critical Dimension Uniformity (CDU), CAD Awareness (CADA), Overlay (OVL), and Lithography process control. MBI refers to defect inspection using measurement. One example of MBI can be detection of etch residue at the bottom of a trench. CDU refers to uniformity measurement related to critical dimension. One example of CDU can be to create a uniformity map of the offset between two contacts. Overlay refers to measurement of the overlay shift between multiple layer patterns. One example of overlay can be to find the nominal overlay error between two layers on the edge of the wafer. CADA refers to the integration of CAD into SEM-based defect inspection. Lithography process control refers to control of a lithography tool and material roughness. Roughness control is one kind of lithography process control and refers to control of material roughness, or elasticity induced roughness.

Therefore, different metrology recipes which are defined with respect to different metrology applications can include different recipe parameters to be tuned during the recipe generation process (or recipe tuning process). The present disclosure is not limited to tuning of a specific metrology recipe, or specific recipe parameters.

A second test (i.e., sensitivity test) can be performed (214) (e.g., by the sensitivity test module 108) on the second image set. The second test comprises: performing (216) the metrology operation on the second image set in accordance with the metrology recipe, giving rise to a plurality of second measurements corresponding to the plurality of second images, and calculating (218) a second score indicative of sensitivity of the metrology recipe based on the plurality of second measurements with respect to the associated ground truth data.

Sensitivity refers to how sensitive the measurements are with respect to changes of sizes of the features of a specimen. By way of example, if the feature of the specimen (e.g., width of a structural element) changes from 10 nm to 10.1 nm, high sensitivity indicates that the corresponding measurement should be sensitive to such change of scales, and the measurement result should reflect such change.

As described above, for the metrology recipe, it is currently not possible to perform a sensitivity test "on the fly" during the recipe creation. This is because, for performing a sensitivity test, ground truth data (e.g., the real changes) of the measurements, must be known so as to be able to compare with the measurement data, and to see whether the measurements indeed reflect such changes. However, in the FAB environment, it is problematic to obtain the ground truth data for the FP images. In some cases, a reference tool, such as, e.g., X-Section TEM, is needed which may be destructive to the specimen.

FIGS. 3A and 3B, as described above, propose an automatic way of simulating a second image set of examination images associated with the ground truth data of the measurements, thereby enabling to perform the sensitivity test during recipe creation.

According to certain embodiments, once a plurality of second measurements corresponding to the plurality of second images are obtained, as described with reference to block 216, a second score can be calculated (218) by estimating a linear regression function between the plurality of second measurements and the associated ground truth data, and obtaining the second score based on the estimated linear regression function.

Figure 7:
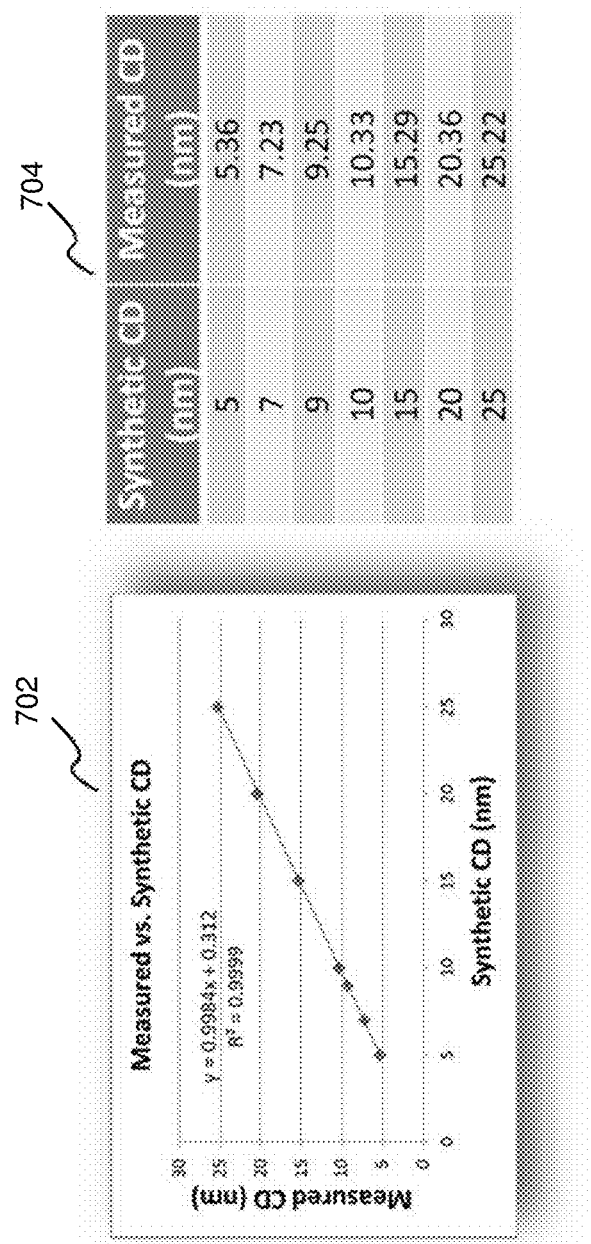
FIG. 7 illustrates an example of estimation of linear regression in accordance with certain embodiments of the presently disclosed subject matter.

Turning now to FIG. 7, there is illustrated an example of estimation of linear regression in accordance with certain embodiments of the presently disclosed subject matter.

Continuing with the example in FIG. 5, using the process as described with reference to FIG. 3B, seven second images can be generated corresponding to the seven design images 501-506 and 406. The seven second images are associated with corresponding ground truth data, e.g., the respective resized scales of the DSE. Therefore, for each second image, a pair of corresponding second measurement (denoted as "measured CD" in FIG. 7) and ground truth data (denoted as "synthetic CD" in FIG. 7) can be obtained, as illustrated in table 704. As shown, table 704 includes seven pairs of measured CD and synthetic CD, corresponding to the seven second images. For instance, a second measurement of 5.36 nm has a corresponding ground truth data of 5 nm associated therewith, and a second measurement of 7.23 nm has a corresponding ground truth data of 7 nm associated therewith. The linear regression, as estimated based on the seven pairs of data, is illustrated in graph 702, where x axis represents the synthetic CD (ground truth data), and y axis represents the measured CD (second measurement). By way of example, the linear regression can be estimated as, e.g., the second measurement=gain*ground truth+offset. In the present example, the gain is estimated as 0.9984, and the offset is estimated as 0.312 nm.

By way of example, in the above exemplified linear regression function, an estimation of the gain equal to 1 indicates an ideal sensitivity of the plurality of second measurements. The second score (i.e., the sensitivity score) can be calculated as, e.g., the deviation of the estimated gain from 1, or the absolute value of such deviation. For instance, in the above example, the gain is estimated as 0.9984, and the second score can be calculated as the deviation of 0.9984 from 1, which is 0.0016. In another example, the second score can be calculated as, e.g., $\exp(-(\text{gain}-1)^2/\text{sigma}^2)$ which provides maximal score when the estimated gain equals 1, where sigma refers to an empirical parameter indicative of the sharpness of the score function. In a further example, average statistical deviation (e.g., $R^2$) of the plurality of the measurements from the linear fit can be calculated and used as the second score. $R^2$ is the square of the Pearson correlation coefficient which is a statistic that measures linear correlation between two variables X and Y. The $R^2$ can be interpreted as the proportion of the variance in y attributable to the variance in x in the linear regression function.

Referring back to FIG. 2A, once the first score and the second score are both obtained, it can be determined (220) (e.g., by the determination module 110 in FIG. 1), in response to a predetermined criterion related to the first score and the second score not being met, to select a second parameter set, configure the metrology recipe with the second parameter set, and repeat the first test and the second test as described above with reference to blocks 204 and 214 in accordance with the metrology recipe configured with the second parameter set, as illustrated with reference to block 222.

According to certain embodiments, the predetermined criterion can be related to a precision criterion and a sensitivity criterion. Specifically, the first score (i.e., the precision score) can be compared with a predetermined precision requirement. The precision requirement can be predefined in accordance with the customer's precision requirement and/or based on previous examination experience. By way of example, the precision requirement can be based on a precision threshold to be compared with the precision score. A precision test result can be obtained based on the comparison.

Similarly, the second score (i.e., the sensitivity score) can be compared with a predetermined sensitivity requirement. The sensitivity requirement can be predefined in accordance with the customer's sensitivity requirement and/or based on previous examination experience. By way of example, the sensitivity requirement can be based on a sensitivity threshold to be compared with the sensitivity score. A sensitivity test result can be obtained based on the comparison.

In the above example, the sensitivity requirement can be set differently according to different ways of calculation of the sensitivity score. For instance, in cases where the sensitivity score is calculated as the deviation of 0.9984 from 1, which is 0.0016, a sensitivity threshold can be set as, e.g., 0.1, and the sensitivity criterion is regarded as being met when the sensitivity score does not exceed such a threshold.

In another example, in cases where the sensitivity score is calculated as, e.g., $\exp(-(gain-1)^2/sigma^2)$ which provides maximal score when the estimated gain equals 1, a sensitivity threshold can be set as, e.g., 0.9, and the sensitivity criterion is regarded as being met when the sensitivity score is not smaller than the threshold.

The predetermined criterion can be considered as being met when both the precision criterion and the sensitivity criterion are satisfied. In cases where the predetermined criterion is met, the metrology recipe configured with the current parameter set is ready to be used for runtime examination of the specimen. In cases where the predetermined criterion is not met (e.g., either the precision criterion or the sensitivity criterion is not satisfied), which indicates the current parameter set does not enable the recipe to provide satisfying performance, a second parameter set (i.e., the recipe parameters set with second values) can be selected and used to configure the metrology recipe, and the first test and the second test are repeated as described above in accordance with the updated metrology recipe.

In some cases, the first test and the second test can be repeated one or more times in accordance with the metrology recipe configured with one or more additional parameter sets, until the predetermined criterion is met, thereby generating a metrology recipe usable for runtime examination of a semiconductor specimen.

In some cases, in addition to precision and sensitivity, the recipe performance measures can further include throughput. Throughput refers to the number of specimens examined in accordance with the recipe per time unit under specified conditions (e.g., standard measurement conditions). In other words, the throughput measure can indicate the speed of the examination using the recipe, or the time utilized to examine one specimen. According to certain embodiments, additionally or alternatively, a third test (i.e., throughput test) can be performed to evaluate the performance of the recipe.

Figure 2B:
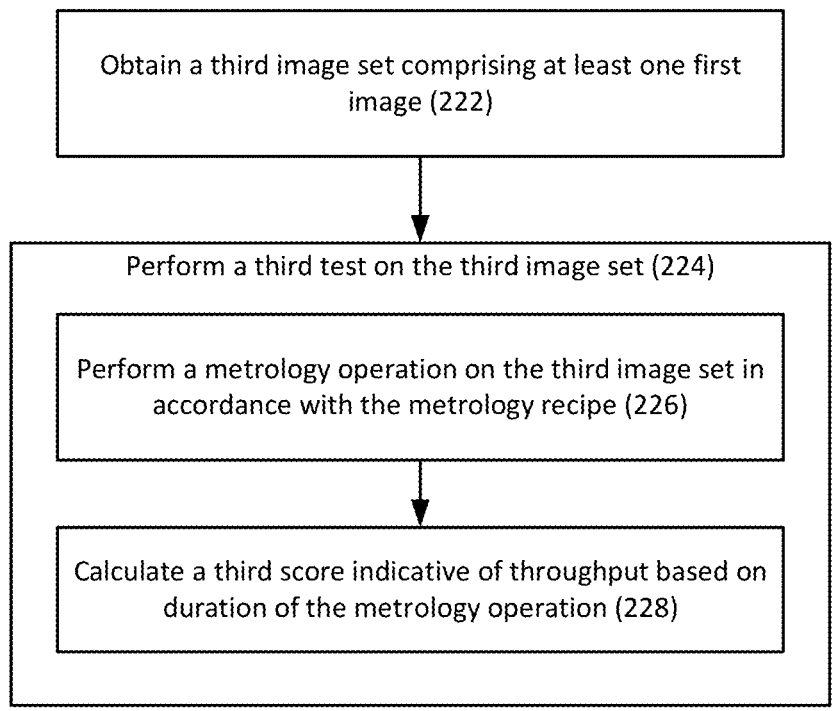
FIG. 2B illustrates a generalized flowchart of a generalized flowchart of performing a third test in accordance with certain embodiments of the presently disclosed subject matter.

Referring to FIG. 2B, there is illustrated a generalized flowchart of performing a third test in accordance with certain embodiments of the presently disclosed subject matter.

In order to test the throughput performance of the recipe (e.g., by a throughput test module (not illustrated in FIG. 1) comprised in the PMC 102), a third image set can be obtained (222) and used for performing the test. By way of example, the third image set can comprise at least one of the first images as comprised in the first image set. A third test can be performed (224) on the third image set, comprising: performing (226) a metrology operation on the third image set in accordance with the metrology recipe, and calculating (228) a third score indicative of throughput of the metrology recipe based on the time duration of the metrology operation being performed.

According to certain embodiments, the throughput test in some cases can be performed in addition to the precision test and the sensitivity test, and the determination of the predetermined criterion being met or not (as described with reference to block 220) can be made based on the three scores instead of two scores. By way of example, the predetermined criterion can be related to a precision criterion, a sensitivity criterion, and a throughput criterion. Specifically, the third score (i.e., the throughput score) can be compared with a predetermined throughput requirement. The throughput requirement can be predefined in accordance with the customer's throughput requirement and/or based on previous examination experience. For instance, the throughput requirement can be based on a throughput threshold to be compared with the throughput score. A throughput test result can be obtained based on the comparison. The predetermined criterion can be considered as being met when the three criteria, i.e., the precision criterion, the sensitivity criterion, and the throughput criterion, are all satisfied.

In some other embodiments, the three tests can be selected and performed in any suitable combination, depending on the recipe performance measures selected by the customer. The present disclosure is not limited by the number of tests and the specific tests performed for evaluating the recipe performance.

When the predetermined criterion is not met, a second parameter set is selected and the metrology recipe is configured with the second parameter set. Considering the number of parameters comprised in the parameter set and the large amount of combinations of various possible parameter values for different parameters (which form a multi-dimensional parameter space), an engineer has to choose which values to assign to each recipe parameter. It is not easy to visualize the impact of changing any specific parameter. Simulation of influence on the measurement quality of such complicated parameter sets is often extremely computationally expensive to run, possibly taking upwards of hours per execution. An exhaustive parameter search for selecting the next parameter set is also not ideal, due to the fact that such a search is a recipe creation time killer, and often cannot provide optimal results.

According to certain embodiments of the present disclosure, it is proposed to select the second parameter set automatically using an optimization method. Optimization generally refers to the selection of a best element (with regard to a certain criterion) from a set of available alternatives. An optimization problem generally includes maximizing or minimizing a function by systematically choosing input values from within an allowed set, and computing the value of the function. In some embodiments of the present disclosure, optimization is used to search in the multi-dimensional parameter space and select the next best parameter set from all the possible combinations. Various optimization algorithms can be used for this purpose, e.g., the Nelder-Mead method, genetic optimization algorithm, etc.

Figure 8:
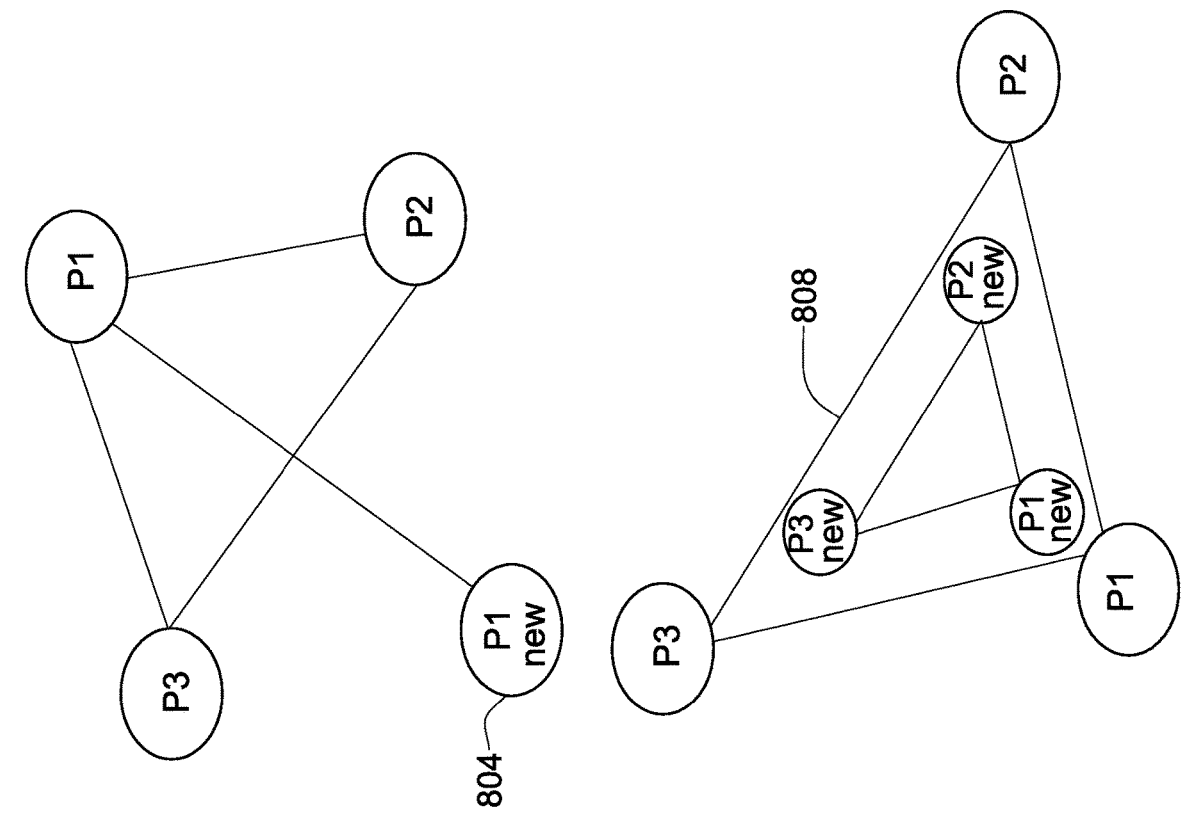
FIG. 8 illustrates an example of selecting the optimal parameter set using a Nelder-Mead optimization method in accordance with certain embodiments of the presently disclosed subject matter.
Figure 8:
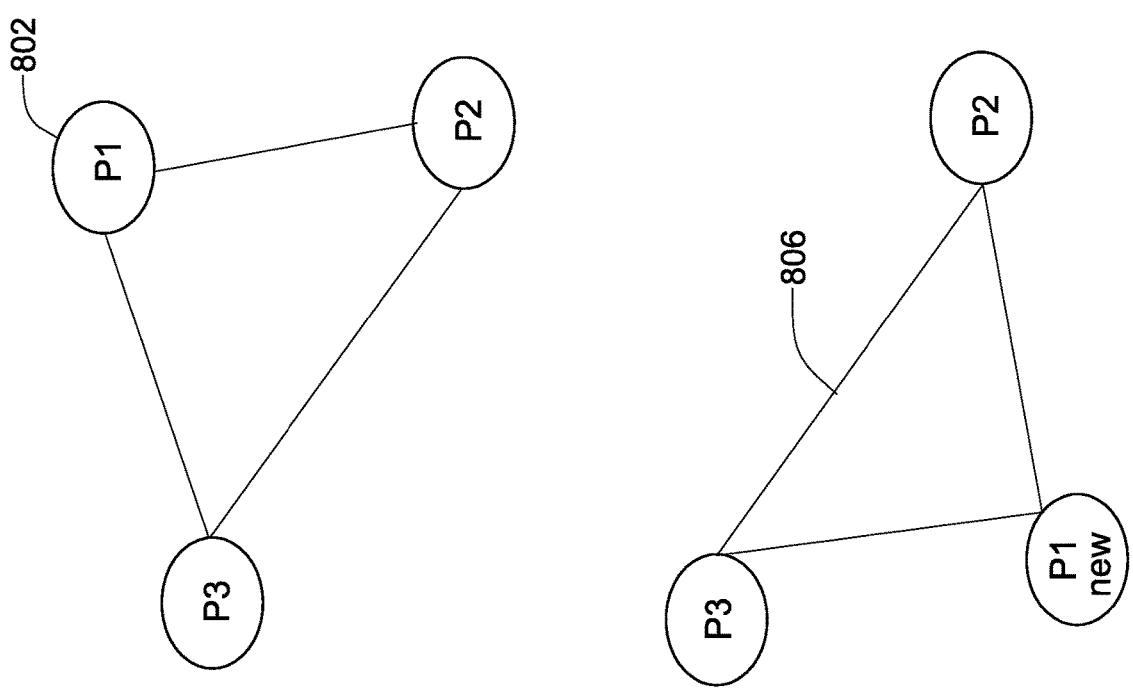

Referring now to FIG. 8, there is illustrated an example of selecting the optimal parameter set using a Nelder-Mead optimization method in accordance with certain embodiments of the presently disclosed subject matter.

The Nelder-Mead (NM) method is a direct search method which can be used to find the minimum or maximum of an objective function in a multidimensional space. The NM method uses the concept of a simplex, which is a special polytope of n+1 vertices in n dimensions, to approximate a local optimum of a problem with n variables. By way of example, the method extrapolates the behavior of the objective function measured at each vertex (test point) in order to find a new test point, and to replace one of the old test points with the new one. For instance, the worst point can be replaced with a point reflected through the centroid of the remaining n points. If the new point is better than the current best point, then the method can continue to search for an optimal point along this direction. On the other hand, if this new point is not much better than the previous value, then the simplex can be shrunk towards a better point.

FIG. 8 illustrates an example of a simplex 802 of 3 vertices {P1, P2, P3} in two-dimensions. Each vertex of the simplex represents a respective parameter set (recipe parameters with respective values) generated based on the first parameter set (e.g., default parameter set).

For each vertex of the simplex in the parameter space, the precision test and the sensitivity test can be performed in accordance with the metrology recipe configured with the respective parameter set represented by the vertex, and a score function can be estimated for the vertex. In some embodiments, the optimization algorithms look for global maxima. Different score functions can be defined corresponding to different ways of calculation of precision score and sensitivity score. By way of example, the score function can be defined as: Score=w1*exp(−Precision^2/sigma_1^2)+w2*exp(−(gain−1)^2/sigma_2^2), where w1, w2, sigma_1, sigma_2 are empirical parameters of the score function, and the best precision which is close to 0 and sensitivity gain which is close to 1 correspond to a maximal score of the score function (the precision and sensitivity gain can be calculated in accordance with the above description with reference to blocks 208 and 218). In such cases, the score function defined as maximum, is the best.

In the example of FIG. 8, assuming after the estimation of the score function, the scores for the three vertices are respectively as follows: P1=0.8; P2=0.91; P3=0.92. The vertex of P1 has the worst score, and therefore will be reflected (e.g., through the centroid of the remaining vertices), forming a new P1, as illustrated in 804. As a result, a new simplex 806 is generated. The score function is estimated for the new P1, and if the new score is better than the previous score of P1, the new P1 can be selected as the second parameter set to be used in block 222 in FIG. 2A. The metrology recipe is configured with the selected second parameter set, and the process of FIG. 2A goes back to blocks 204 and 214 to repeat the first test and second test using the second parameter set. If the predetermined criterion is still not met at block 220, then the above process of selecting the worst vertex (the one having the worst score), and reflecting it, can be repeated, and a third parameter set can be selected to repeat the process in FIG. 2A. This process can be iteratively performed until the vertices converge to an optimal point. The optimal point represents the optimal parameter set that is eventually selected for generating the metrology recipe. If, at a certain point, the scores of the vertices stop increasing, the simplex can be scaled (e.g., to a smaller size, as exemplified in 808), and the above process can continue in the scaled simplex. The scaling can enable to obtain more accurate value of local extremum when the simplex is close to the optimal point.

Using such an optimization method, an optimal parameter set can be automatically and efficiently identified, which provides optimal recipe performance.

It is to be noted that the NM method, as described above, is illustrated for exemplary purposes, and should not be regarded as limiting the present disclosure in any way. Other optimization methods can be used in addition to or in lieu of the above. The present disclosure is not limited by the specific optimization method used for selecting the next parameter sets.

Among advantages of certain embodiments of the recipe creation/tuning process as described herein is to generate a simulated image set associated with ground truth data which enables to perform a sensitivity test of the metrology recipe, thereby improving the recipe's sensitivity performance in addition to the precision performance.

Among further advantages of certain embodiments of the recipe creation/tuning process as described herein, is that the recipe tuning process is automated by using an optimization algorithm to search for the optimal parameter set, thereby enabling to shorten the time-to-recipe and result in optimal recipe performance.

It is to be noted that the illustrated examples are described herein for illustrative purposes, and should not be regarded as limiting the present disclosure in any way. Other suitable examples can be used in addition to, or in lieu of, the above.

It is to be understood that the present disclosure is not limited in its application to the details set forth in the description contained herein or illustrated in the drawings.

It will also be understood that the system according to the present disclosure may be, at least partly, implemented on a suitably programmed computer. Likewise, the present disclosure contemplates a computer program being readable by a computer for executing the method of the present disclosure. The present disclosure further contemplates a non-transitory computer-readable memory tangibly embodying a program of instructions executable by the computer for executing the method of the present disclosure.

The present disclosure is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the present disclosure as hereinbefore described without departing from its scope, defined in and by the appended claims.

The invention claimed is:

1. A computerized system of generating a metrology recipe usable for examining a semiconductor specimen, the system comprising a processing and memory circuitry (PMC) configured to peform operations comprising:
    obtaining a first image set comprising a plurality of first images captured by an examination tool, each first image informative of at least one first image structural element (ISE) representing at least one structural element (SE) on the semiconductor specimen;
    obtaining a second image set comprising a plurality of second images, wherein each second image is simulated based on at least one first image and informative of at least one second ISE representing the at least one SE, wherein the at least one second ISE in each second image is resized to a respective scale with reference to the at least one first ISE, and wherein each second image is associated with ground truth data related to the respective scale of the at least one second ISE;
    performing a first test on the first image set, comprising: performing a metrology operation on the first image set in accordance with a metrology recipe configured with a first parameter set, giving rise to a plurality of first measurements corresponding to the plurality of first images, and calculating a first score indicative of precision of the metrology recipe based on the plurality of first measurements;
    performing a second test on the second image set, comprising: performing the metrology operation on the second image set in accordance with the metrology recipe, giving rise to a plurality of second measurements corresponding to the plurality of second images, and calculating a second score indicative of sensitivity of the metrology recipe based on the plurality of second measurements with respect to the associated ground truth data; and determining, in response to a predetermined criterion related to the first score and the second score not being met, to select a second parameter set, configure the metrology recipe with the second parameter set, and repeat the first test and the second test in accordance with the metrology recipe configured with the second parameter set.

2. The computerized system according to claim 1, wherein the plurality of first images are captured from one or more sites on the semiconductor specimen.

3. The computerized system according to claim 1, wherein the PMC is further configured to perform further operations comprising generating the second image set, comprising:
  generating a first design image based on the at least one first image, the first design image informative of at least one design structural element (DSE) corresponding to the at least one ISE and associated with first ground truth data related to a first scale of the at least one DSE;
  generating one or more additional design images each informative of the at least one DSE resized to a respective scale with reference to the first scale, giving rise to a plurality of design images comprising the first design image and the additional design images associated with respective ground truth data related to respective scales of the at least one DSE; and
  using the plurality of design images to generate the second image set, comprising: simulating, based on the plurality of design images, one or more effects caused by one or more physical processes of the semiconductor specimen, giving rise to the plurality of second images associated with the respective ground truth data.

4. The computerized system according to claim 3, wherein the simulating comprises:
  performing a first simulation on the plurality of design images to simulate effects caused by a fabrication process of the semiconductor specimen, giving rise to a plurality of first simulated images;
  performing a second simulation on the plurality of first simulated images to simulate effects caused by a scanning process of the semiconductor specimen, giving rise to a plurality of second simulated images;
  performing a third simulation on the plurality of second images to simulate effects caused by a signal processing process of the semiconductor specimen, giving rise to the plurality of second images; and
  associating the plurality of second images with the respective ground truth data.

5. The computerized system according to claim 1, wherein the PMC is configured to calculate the first score by calculating variance among the plurality of first measurements based on a precision measure.

6. The computerized system according to claim 1, wherein the PMC is configured to calculate the second score by estimating a linear regression function between the plurality of second measurements and the associated ground truth data, and obtaining the second score based on the estimated linear regression function.

7. The computerized system according to claim 1, wherein the PMC is further configured to obtain a third image set comprising at least one first image, and perform a third test on the third image set, comprising: perform a metrology operation on the third image set in accordance with the metrology recipe, and calculate a third score indicative of throughput of the metrology recipe based on duration of the metrology operation.

8. The computerized system according to claim 1, wherein the first parameter set comprises a plurality of recipe parameters assigned with first values, the recipe parameters selected from a group comprising: measurement algorithm parameters and image generation parameters.

9. The computerized system according to claim 8, wherein the second parameter set comprises the plurality of recipe parameters assigned with second values which are selected automatically using an optimization method.

10. The computerized system according to claim 1, wherein the PMC is further configured to repeat the first test and the second test one or more times in accordance with the metrology recipe configured with one or more additional parameter sets, until the predetermined criterion is met, thereby generating a metrology recipe usable for runtime examination of the semiconductor specimen.

11. The computerized system according to claim 1, wherein the metrology recipe is defined in accordance with a metrology application selected from a group comprising: Measurement-Based Inspection (MBI), Critical Dimension Uniformity (CDU), Lithography process control, CAD Awareness (CADA), and Overlay (OVL).

12. A computerized method of generating a metrology recipe usable for examining a semiconductor specimen, the method performed by a processing and memory circuitry (PMC), the method comprising:
  obtaining a first image set comprising a plurality of first images captured by an examination tool, each first image informative of at least one first image structural element (ISE) representing at least one structural element (SE) on the semiconductor specimen;
  obtaining a second image set comprising a plurality of second images, wherein each second image is simulated based on at least one first image and informative of at least one second ISE representing the at least one SE, wherein the at least one second ISE in each second image is resized to a respective scale with reference to the at least one first ISE, and wherein each second image is associated with ground truth data related to the respective scale of the at least one second ISE;
  performing a first test on the first image set, comprising: performing a metrology operation on the first image set in accordance with a metrology recipe configured with a first parameter set, giving rise to a plurality of first measurements corresponding to the plurality of first images, and calculating a first score indicative of precision of the metrology recipe based on the plurality of first measurements;
  performing a second test on the second image set, comprising: performing the metrology operation on the second image set in accordance with the metrology recipe, giving rise to a plurality of second measurements corresponding to the plurality of second images, and calculating a second score indicative of sensitivity of the metrology recipe based on the plurality of second measurements with respect to the associated ground truth data; and
  determining, in response to a predetermined criterion related to the first score and the second score not being met, to select a second parameter set, configure the metrology recipe with the second parameter set, and repeat the first test and the second test in accordance with the metrology recipe configured with the second parameter set.

13. The computerized method according to claim 12, wherein the plurality of first images are captured from one or more sites on the semiconductor specimen.

14. The computerized method according to claim 12, wherein the second image set is generated by:
  generating a first design image based on the at least one first image, the first design image informative of at least one design structural element (DSE) corresponding to the at least one ISE and associated with first ground truth data related to a first scale of the at least one DSE;
  generating one or more additional design images each informative of the at least one DSE resized to a respective scale with reference to the first scale, giving rise to a plurality of design images comprising the first design image and the additional design images associated with respective ground truth data related to respective scales of the at least one DSE; and
  using the plurality of design images to generate the second image set, comprising: simulating, based on the plurality of design images, one or more effects caused by one or more physical processes of the semiconductor specimen, giving rise to the plurality of second images associated with the respective ground truth data.

15. The computerized method according to claim 14, wherein the simulating comprises:
  performing a first simulation on the plurality of design images to simulate effects caused by a fabrication process of the semiconductor specimen, giving rise to a plurality of first simulated images;
  performing a second simulation on the plurality of first simulated images to simulate effects caused by a scanning process of the semiconductor specimen, giving rise to a plurality of second simulated images;
  performing a third simulation on the plurality of second images to simulate effects caused by a signal processing process of the semiconductor specimen, giving rise to the plurality of second images; and
  associating the plurality of second images with the respective ground truth data.

16. The computerized method according to claim 12, wherein the first score is calculated by calculating variance among the plurality of first measurements based on a precision measure.

17. The computerized method according to claim 12, wherein the second score is calculated by estimating a linear regression function between the plurality of second measurements and the associated ground truth data, and obtaining the second score based on the estimated linear regression function.

18. The computerized method according to claim 12, further comprising obtaining a third image set comprising at least one first image, and performing a third test on the third image set, comprising: performing a metrology operation on the third image set in accordance with the metrology recipe, and calculating a third score indicative of throughput of the metrology recipe based on duration of the metrology operation, wherein the predetermined criterion is further related to the third score.

19. The computerized method according to claim 12, further comprising repeating the first test and the second test one or more times in accordance with the metrology recipe configured with one or more additional parameter sets, until the predetermined criterion is met, thereby generating a metrology recipe usable for runtime examination of a semiconductor specimen.

20. A non-transitory computer readable storage medium tangibly embodying a program of instructions that, when executed by a computer, cause the computer to perform a method of generating a metrology recipe usable for examining a semiconductor specimen, the method comprising:
  obtaining a first image set comprising a plurality of first images captured by an examination tool, each first image informative of at least one first image structural element (ISE) representing at least one structural element (SE) on the semiconductor specimen;
  obtaining a second image set comprising a plurality of second images, wherein each second image is simulated based on at least one first image and informative of at least one second ISE representing the at least one SE, wherein the at least one second ISE in each second image is resized to a respective scale with reference to the at least one first ISE, and wherein each second image is associated with ground truth data related to the respective scale of the at least one second ISE;
  performing a first test on the first image set, comprising: performing a metrology operation on the first image set in accordance with a metrology recipe configured with a first parameter set, giving rise to a plurality of first measurements corresponding to the plurality of first images, and calculating a first score indicative of precision of the metrology recipe based on the plurality of first measurements;
  performing a second test on the second image set, comprising: performing the metrology operation on the second image set in accordance with the metrology recipe, giving rise to a plurality of second measurements corresponding to the plurality of second images, and calculating a second score indicative of sensitivity of the metrology recipe based on the plurality of second measurements with respect to the associated ground truth data; and
  determining, in response to a predetermined criterion related to the first score and the second score not being met, to select a second parameter set, configure the metrology recipe with the second parameter set, and repeat the first test and the second test in accordance with the metrology recipe configured with the second parameter set.

* * * * *